United States Patent [19]

D'Angelo et al.

[11] Patent Number: 4,900,525
[45] Date of Patent: Feb. 13, 1990

[54] CHEMICAL VAPOR DEPOSITION REACTOR FOR PRODUCING METAL CARBIDE OR NITRIDE WHISKERS

[75] Inventors: Charles D'Angelo, Southboro; Joseph G. Baldoni, II, Norfolk; Sergej-Tomislav Buljan, Acton, all of Mass.

[73] Assignee: GTE Laboratories Incorporated, Waltham, Mass.

[21] Appl. No.: 899,834

[22] Filed: Aug. 25, 1986

[51] Int. Cl.⁴ ...................... C30B 29/62; C30B 35/00
[52] U.S. Cl. ..................................... 422/245; 422/254; 118/715; 118/719; 118/722; 118/729; 423/345; 156/DIG. 99; 156/DIG. 112
[58] Field of Search ................ 422/245, 254; 118/715, 118/719, 722, 729; 423/345, 346; 156/DIG. 99, DIG. 112

[56] References Cited

U.S. PATENT DOCUMENTS

| | | | |
|---|---|---|---|
| 3,244,480 | 4/1966 | Johnson et al. | 23/191 |
| 3,403,008 | 9/1968 | Hamling | 23/344 |
| 3,437,443 | 4/1969 | Hertl | 23/202 |
| 3,582,271 | 6/1971 | Minagawa et al. | 23/142 |
| 3,709,981 | 1/1973 | Lee et al. | 423/346 |
| 3,752,655 | 8/1973 | Ramqvist | 29/182.5 |
| 3,837,812 | 9/1974 | Boontje | 422/245 |
| 3,979,500 | 9/1976 | Sheppard et al. | 423/346 |
| 4,214,037 | 7/1980 | Galasso et al. | 428/367 |
| 4,443,410 | 4/1984 | Zaferes | 422/245 |
| 4,500,504 | 2/1985 | Yamamoto | 423/345 |
| 4,521,393 | 6/1985 | Saito et al. | 423/344 |
| 4,525,335 | 6/1985 | Tanaka et al. | 423/344 |
| 4,552,740 | 11/1985 | Morgan et al. | 423/344 |
| 4,569,886 | 2/1986 | Divecha et al. | 428/379 |
| 4,579,699 | 4/1986 | Verzemnieks | 264/043 |
| 4,590,024 | 5/1986 | Lesk et al. | 118/719 |
| 4,604,273 | 8/1986 | Czupryna et al. | 423/344 |

FOREIGN PATENT DOCUMENTS

| | | | |
|---|---|---|---|
| 813788 | 5/1969 | Canada | 423/346 |
| 54-020971 | 2/1979 | Japan | 118/715 |
| 60-033352 | 2/1985 | Japan | 118/715 |
| 61-077151 | 1/1986 | Japan | 118/715 |
| 61-068393 | 4/1986 | Japan | 422/245 |
| 61-085818 | 5/1986 | Japan | 118/715 |

OTHER PUBLICATIONS

Akio Kato et al., *J. Crystal Growth*, 37, pp. 293-300 (1977).
Akio Kato et al., *J. Crystal Growth*, 49, pp. 199-203 (1980).
Keiji Naito, *J. Crystal Growth*, 45, pp. 506-510 (1978).
H Altena et al., *Euro CVD Four, Proc. Eur. Conf. Chem. Vap. Deposition*, 4th J. Bloem, Ed., pp. 428-434 (1983).
M. Futamoto et al., *J. Crystal Growth*, 61, pp. 69-74 (1983).
Kenji Hamamura et al., *J. Crystal Growth*, 2 6, pp. 255-260 (1974).
Takehiko Takahashi et al., *J. Electrochem. Soc.*, 117, pp. 541-545 (1970).
Nobuyuki Tamari et al., *J. Less-Common Metals*, 58, pp. 147-160 (1978).
Nobuyuki Tamari et al., *J. Crystal Growth*, 46, pp. 221-237, (1979).
Wokulski ewt al., *J. Crystal Growth*, 62, pp. 439-446 (1983).
Wokulski et al., *Conf. Appl. Crystallogr.*, 11, pp. 258-263 (1984).

Primary Examiner—John Doll
Assistant Examiner—Robert M. Kunemund
Attorney, Agent, or Firm—Frances P. Craig

[57] ABSTRACT

A reactor for producing single crystal metal carbide, nitride, or carbonitride whiskers, where the metal is one or more of Ti, Zr, Hf, Nb, Ta or W. The reactor walls and inner fixtures provide the substrate surfaces, greatly increasing the surface area available for whisker growth. Preferred substrate materials are nickel or high nickel alloy coated with TiC or TiN, or, for carbide or carbonitride whiskers, nickel impregnated graphite. An alternate embodiment provides a collecting chamber and vibrating means to mechanically detach whiskers, allowing for more efficient batch, or continuous operation.

10 Claims, 3 Drawing Sheets

CHEMICAL VAPOR DEPOSITION REACTOR FOR PRODUCING METAL CARBIDE OR NITRIDE WHISKERS

CROSS-REFERENCE TO RELATED APPLICATIONS

This application contains subject matter related to matter disclosed in copending application Ser. Nos. 06/899,835 and 06/899,833, now issued as U.S. Pat. Nos. 4,810,530 and 4,756,791 respectively, and 07/272,029, division of application No. 06/899,835, both filed concurrently with the present application and both assigned to the same Assignee as the present application. Application Nos. 06/899,835, and 06/899,833 are incorporated herein by reference.

FIELD OF THE INVENTION

This invention relates to a reactor for producing single crystal metal carbide, nitride, or carbonitride whiskers, particularly for producing metal carbide, nitride, or carbonitride whiskers by a chemical vapor deposition process.

BACKGROUND OF THE INVENTION

In recent years there has been an increasing need for composite materials having high fracture toughness, hardness and wear resistance for use in cutting tools, wear parts, and structural applications such as, dies, turbines, nozzles, etc. Due to their high modulus of elasticity, high hardness, and high strength single crystal whiskers of such materials as carbides, nitrides, or carbonitrides of titanium, zirconium, hafnium, niobium, tantalum, or tungsten could present attractive materials for composite technology. However, prior to the present invention, apparatus for producing such whiskers in commercial quantities has not been known.

Known laboratory methods for producing whiskers of metal carbides or nitrides involve placing a suitable substrate material for whisker growth at the center of a quartz tube, heating the substrate material to a temperature suitable for whisker growth, flushing the reactor tube with hydrogen, and flowing the reactant gases through the heated reactor to form whiskers on the substrate material. The prior art has presented the disadvantages of contamination of the whiskers by impurities emanating from the hot quartz tube, decomposition of the reactants subjected to heating before reaching the substrate material, and a severe limitation on the quantity of whisker production in such reactor arrangements.

SUMMARY OF THE INVENTION

The reactors of the present invention overcome the above described limitations in that they provide significantly increased surface area within the reactor of materials suitable for whisker growth, even to the point of making it possible to utilize substantially all of the surfaces internal to the reaction chamber for efficient whisker growth, and providing immediate access of the gaseous reactants entering the reaction chamber to the substrate surfaces. Further, in one embodiment of the invention, the reactor includes a collecting chamber below the reaction chamber, and vibrating means to detach at least some of the whiskers from substrate surfaces. This arrangement makes possible nucleation and growth of several batches of whiskers within the reactor with continuous gas flow, and without disassembling the reactor to remove each batch of whiskers.

A reactor according to the invention for producing metal carbide, nitride, or carbonitride whiskers comprises a reaction vessel having outer walls generally enclosing a reaction chamber, sealed from the ambient atmosphere and adapted to cooperate with heating means for heating of the reaction chamber to an operating temperature suitable for whisker growth; gas inlet means; and gas outlet means. At least one of the outer walls, inlet means, and outlet means provides surfaces facing or defining the reaction chamber formed from one or more substrate materials suitable for providing catalyzing and supporting substrates for nucleation and growth of the whiskers. The surface area of the substrate material surfaces is at least a major portion of the total surface area of surfaces defining the reaction chamber. In a preferred reaction vessel, at least one of the inlet means and the outlet means includes one or more conduits extending into the reaction chamber and providing at least some of the substrate material surfaces In an especially preferred embodiment, at least one rod extends from the one or more conduits into the reaction chamber, and provides at least some of the substrate material surfaces.

A preferred reactor according to the invention further comprises a collection vessel having outer walls enclosing a collection chamber sealed from the ambient atmosphere, arranged generally vertically below and open to the reaction chamber, and adapted to be maintained at a temperature sufficiently below the operating temperature to preclude significant whisker production in the collection chamber. Whisker detaching means is arranged to periodically vibrate at least one of the outer walls, inlet means, and outlet means, to detach at least some of the whiskers from the substrates.

In a preferred reactor for producing metal carbide, nitride, or carbonitride whiskers, the one or more substrate materials are nickel coated with a titanium carbide or nitride layer about 20-30 microns thick, an alloy containing at least 50% by weight nickel and coated with a titanium carbide or nitride layer about 20-30 microns thick, or, for carbide or carbonitride whiskers, graphite impregnated with about 0.1-1.0 mole % nickel.

In another preferred embodiment according to the invention, a reactor for producing metal carbide, nitride, or carbonitride whiskers includes a reactor vessel sealed from the ambient atmosphere, and having an upper reaction chamber and a lower collecting chamber. The upper chamber has a top wall and side walls and is adapted to cooperate with heating means for heating of the reaction chamber to an operating temperature suitable for whisker growth. The lower chamber has at least a bottom wall, and is disposed generally vertically below and open to the upper chamber and is generally coaxial with the upper chamber, and is adapted to be maintained at a temperature sufficiently below the operating temperature to preclude significant whisker production in the lower chamber. A gas inlet port is provided through the bottom wall. A plurality of inlet tubes each having at least one aperture are disposed near the top wall and extend radially across the upper chamber from near the axis of the chamber to near the side walls. A conduit extends along the axes of the chambers to operationally interconnect the inlet port and the inlet tubes for gas flow from the inlet port through the inlet tube apertures into the upper chamber. Outlet means are provided to permit the flowing gas to exit the vessel. A plurality of rods extends radially from the axial conduit into the upper chamber. At least the inner surfaces of the side walls of the upper chamber, and the outer surfaces of the inlet tubes, the axial conduit, and the rods are formed from one or more substrate materials. The substrate materials are nickel or an alloy containing at least 50% by weight nickel coated with a titanium carbide or nitride layer about 20-30 microns thick, or, for producing metal carbide or carbonitride whiskers, graphite impregnated with about 0.1-1.0 mole % nickel. Whisker detaching means is arranged to periodically, during operation, vibrate at least the axial conduit to detach at least some of the whiskers from the substrate surfaces.

BRIEF DESCRIPTION OF THE DRAWINGS

Details relating to the reactors according to the invention as well as the advantages derived therefrom will be more fully appreciated by referring to the Detailed Description of the Preferred Embodiments taken in connection with the Drawings, in which.

DETAILED DESCRIPTION OF THE PREFERRED EMBODIMENTS

Figure 1:
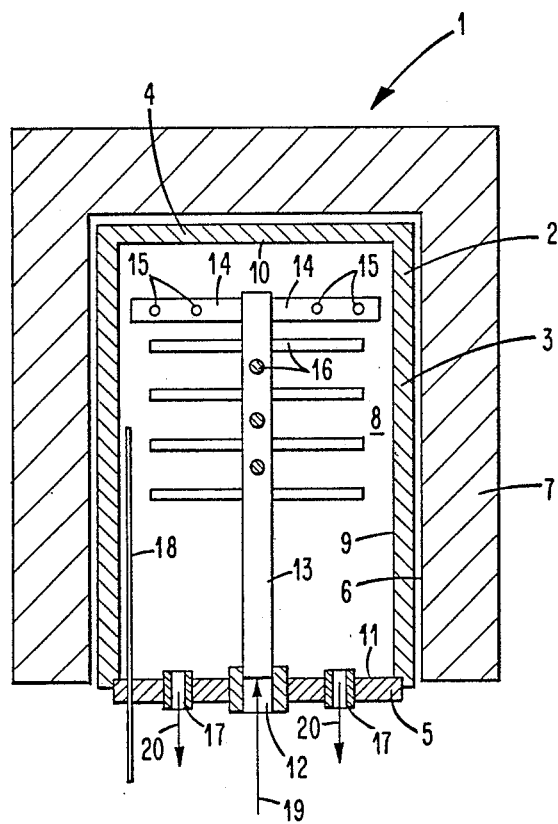
FIG. 1 is a cross-sectional view of a reactor according to the invention.

A typical reactor 1 according to the invention is illustrated in FIG. 1. A cylindrical reaction vessel 2 having generally vertically side walls 3, a top wall 4, and a removable bottom wall 5, all formed from a high nickel alloy containing greater than 50% by weight nickel, for example "Inconel" containing about 76% by weight nickel, is insertable into an opening 6 in furnace 7 for heating of reaction chamber 8 to an operating temperature suitable for whisker growth. An illustrative reaction vessel 2 is about 12.5 cm inside diameter and about 53 cm in inside height, of which about 15-20 cm is used for whisker growth. Alternatively, reaction vessel 2 may be constructed of other materials normally used for chemical vapor deposition (CVD) reaction vessels, and inner surfaces 9, 10, and 11 of walls 3, 4, and 5 may have all or significant portions of their surfaces lined, coated or plated with a high nickel alloy or other materials suitable for whisker growth structures.

Bottom wall 5 of reaction vessel 2 includes inlet port 12 concentric with bottom wall 5. Conduit 13, centrally disposed along the axis of cylindrical reaction vessel 2, interconnects inlet port 12 to inlet tubes 14 extending radially into reaction chamber 8 near top wall 4 of the reaction vessel. Apertures 15 in inlet tubes 14 permit gases entering through inlet port 12, axial conduit 13, and inlet tubes 14 to enter reaction chamber 8. Conduit 13 and inlet tubes 14 are also preferably formed of the high nickel alloy used to construct reaction vessel 2.

The surface area available for whisker growth may be increased by providing rods, as 16, extending radially from axial conduit 13 into reaction chamber 8. Rods 16 are also, preferably, formed of the high nickel alloy used for reaction vessel 2.

In a manner similar to that described for the walls of reaction vessel 2, the surfaces of conduit 13, inlet tubes 14 and rods 16 may be constructed of other materials, and may have significant portions of their outer surfaces covered or plated with a high nickel alloy or other materials suitable for whisker growth structures.

One or more gas outlet means 17 are provided in bottom wall 5 to permit the gases entering the reaction chamber through apertures 15 in inlet tubes 14 to exit the reaction chamber. Thermocouple 18 extending into the reaction chamber may be used to monitor the operating temperature. Reactor 1 is sealed from the ambient atmosphere in known manner to prevent contamination of the whiskers grown therein.

It is an important feature of the reactor according to the invention that at least a major portion (greater than 50%) of the surface area of the surfaces facing or defining the reaction chamber provide surfaces on which the metal carbide or nitride whiskers will grow under suitable reaction conditions. Preferably, substantially all of the surfaces facing or defining the reaction chamber are suitable for whisker growth. Most preferred is a reactor providing at least 700 cm$^2$ of suitable surfaces, and, in larger reactors, substrate surface areas several orders of magnitude higher are possible.

Materials useful for the substrate surfaces for growth of the carbide, nitride, or carbonitride whiskers include nickel, high nickel alloys containing at least 50% by weight nickel, and, for carbide or carbonitride whiskers, graphite. For the most efficient carbide or carbonitride whisker growth and optimum whisker morphology, the nickel and nickel alloy surfaces are coated with a thin layer, about 20-30 microns thick, of a metal carbide or nitride in which the metal is titanium, zirconium, hafnium, niobium, tantalum or tungsten. The coating may be applied before or after the assembly of the reactor, for example by known CVD methods. While not desiring to limit the invention by an explanation of this phenomenon, it would appear that the metal carbide or nitride coating serves to regulate the amount of nickel diffusing to the surface of the substrate material to catalyze the whisker forming reaction. Also, for the most efficient carbide or carbonitride whisker growth, the graphite surfaces are doped or impregnated with nickel, preferably at 0.1-1.0 mole % nickel to catalyze the reaction. The preferred reactor is constructed of a high nickel alloy, for example "Inconel", coated with a 20-30 micron layer of titanium carbide.

Optimum carbide or carbonitride whisker growth may be achieved in the reactors having nickel or nickel alloy reaction surfaces by coating the reaction surfaces with a thin film of pyrolyzed carbon prior to whisker growth, as described in application No. 06/899,833, referenced above.

In operation, reactor 1 is inserted into opening 6 of furnace 7, and heated to an operating temperature suitable for growth of metal carbide, nitride, or carbonitride whiskers, while being flushed with an inert gas such as argon. The argon follows the gas flow path described above, entering inlet port 12, as shown by arrow 19, from a source (not shown), traveling along axial conduit 13 into inlet tubes 14, entering reaction chamber 8 through apertures 15, and exiting the reaction chamber, as shown by arrows 20, through outlet means 17. The heated reaction chamber is then flushed with hydrogen gas, flowing at about ambient pressure along the same gas flow path described above for the inert gas, to clean reaction chamber 8 of any impurities present which may affect whisker growth.

For the growth of carbide whiskers, following the flushing of the reactor with hydrogen, methane is introduced to the hydrogen stream and allowed to flow through heated reaction chamber 8 for several minutes. The methane entering the heated reaction chamber is pyrolyzed at the operating temperature to form a thin film of free carbon on at least the substrate surfaces of the reaction chamber. This step may also be used for carbonitride whisker growth. The pressure within the reaction chamber preferably is maintained at about 1 atmosphere throughout the operation of the reactor, although pressures from about 1-2 atmospheres are suitable.

Following any necessary preparation of the reaction surfaces, the flow of hydrogen is maintained, with the addition of reactant gases, at a flow rate and at a vapor pressure suitable for whisker growth. The flow of reactant gases is maintained for a time sufficient for whisker growth, typically 1-6 hours. Following the whisker growth, the flow of reactant gases is stopped, and the flow of hydrogen gas is maintained while the reactor is cooled to ambient temperature. Finally, the reactor is flushed with an inert gas such as argon, and the reactor is opened for removal of the whiskers.

Figure 2:
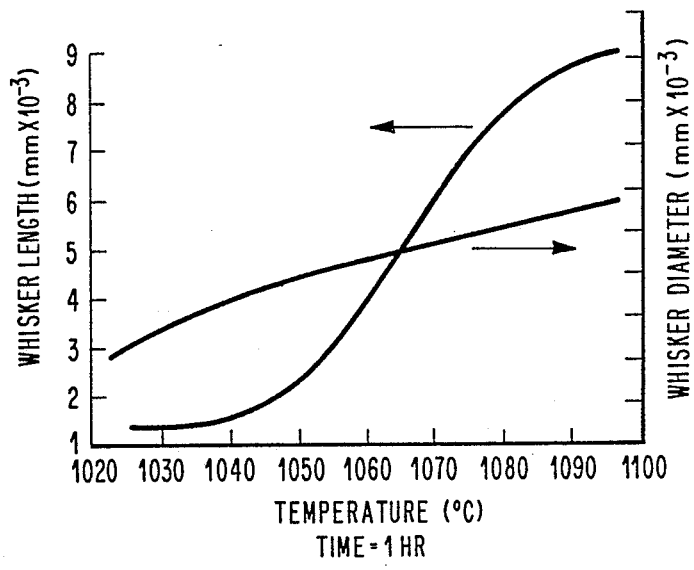
FIG. 2 is a graphical representation showing the relation between growth of titanium carbide whiskers and time.
Figure 3:
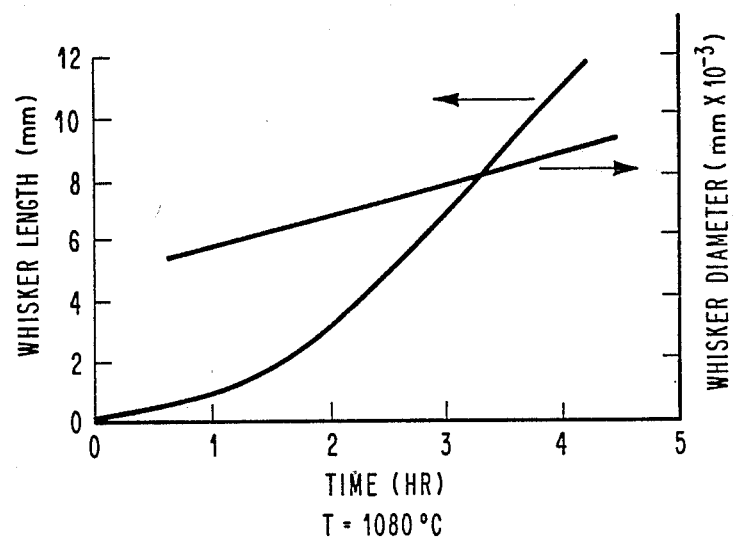
FIG. 3 is a graphical representation showing the relationship between growth of titanium carbide whiskers and temperature.

Representative relationships between metal carbide, nitride, or carbonitride whisker growth and time and temperature are illustrated in FIGS. 2 and 3. FIG. 2 shows that, after an initial nucleation period, the growth of titanium carbide whiskers, grown using the process described above in an "Inconel" reactor, is linear both in length and diameter with growth time. The dependence of the titanium carbide whisker growth on temperature is illustrated in FIG. 3. These relationships are typical for metal carbide, nitride, or carbonitride whiskers. As may be seen by examining FIGS. 2 and 3, the aspect ratio of length to diameter of the whiskers may be controlled by adjusting the time and temperature conditions of the whisker growth process.

Titanium carbide whiskers were grown from methane and titanium tetrachloride reactants under suitable reaction conditions and using a reactor according to the invention having titanium carbide coated and carburized high nickel alloy reaction surfaces, as described above. The whiskers were observed using optical and scanning electron microscopy, and were found to be uniform in diameter, straight, smooth surfaced, and free of distortion. Electron diffraction showed the whiskers to be single crystal, while back-scatter electron channeling (transmission electron microscope) revealed three different growth axes, which are commonly found in titanium carbide whiskers, i.e. {100}, {110}, {111}. X-ray diffraction confirmed the material to be titanium carbide having {100}, {110}, and {111} growth axes. Total carbon and free carbon content were determined by conductometric analysis and found to be close to theoretical value. This is an important finding, since the stoichiometry of whisker material determines to some extent the ductility and toughness. The impurities and their distribution in the titanium carbide whiskers were observed by emission spectroscopy and x-ray microanalysis. The total impurity content was found to be less than 1%. Microhardness was measured at room temperature by Knoop microhardness indentor and found to be 3300 Kg/mm$^2$±300 Kg/mm$^2$. The whiskers were uniform in diameter, having an aspect ratio of length to diameter of about 100:1, and had highly reflective surfaces without pits or other observable defects, indicating enhanced strength and usefulness in composites.

Although the above description deals with the growth of titanium carbide whiskers on coated and carburized high nickel alloy surfaces, using titanium tetrachloride and methane as reactants, the reactor according to the invention is not limited to this specific process. For example, the reactant gases may include halides of one or more of titanium, zirconium, hafnium, niobium, tantalum, or tungsten. Hydrocarbon gases useful for carburizing nickel and nickel alloy reactor surfaces, and as reactants for carbide, and carbonitride whisker growth, include hydrocarbon compounds of the formulas $C_nH_{2n+1}$, $C_nH_{2n}$, or $C_nH_{2n-2}$, where n is a positive integer of 1-4. Preferred hydrocarbons are methane, propane, and acetylene. Nitride whiskers may be grown using the metal halides above, and nitrogen or nitrogen containing gases such as ammonia as reactants.

Reactor surfaces preferred for the growth of metal carbide, nitride, or carbonitride whiskers, as described above, include nickel or an alloy containing at least 50% by weight nickel coated with a titanium carbide or other metal carbide or nitride layer about 20-30 microns thick, or, for the growth of carbide or carbonitride whiskers, graphite impregnated with about 0.1-1.0 mole % nickel. The reaction vessel and inner fixtures used for whisker growth may be formed from solid nickel, high nickel alloy, or graphite, or alternatively may be lined or plated with these materials. In the case of the carbide or nitride coated nickel or nickel alloy for carbide whisker growth, carburizing of the reaction surfaces, i.e. forming a thin film of pyrolytic carbon thereon, appears to be an important step in preparing the substrate material surfaces for optimum carbide whisker growth.

Figure 4:
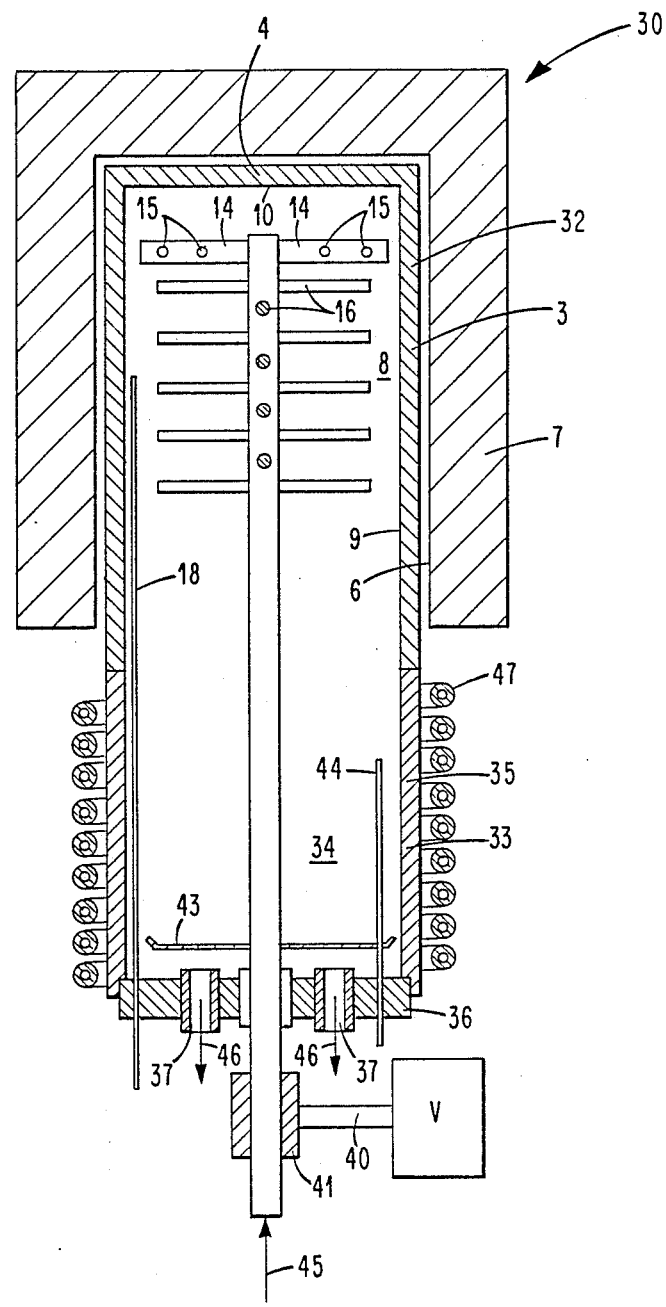
FIG. 4 is a cross-sectional view of an alternate embodiment of a reactor according to the invention.

An alternative embodiment 30 of a reactor according to the invention is illustrated in FIG. 4, in which structures similar to those illustrated in FIG. 1 are identified by the same reference numerals. Upper cylindrical reaction vessel 32 provides reaction chamber 8, while lower cylindrical collecting vessel 33 provides lower collecting chamber 34. Lower vessel 33 has side walls 35 and bottom wall 36. Outlet means 37 are provided in bottom wall 36 of lower vessel 33, to permit the flowing gas to exit the vessel, serving a similar purpose to outlet means 17 of FIG. 1, described above. Axial conduit 38 extends from outside reactor 30, entering the reactor through inlet opening 39, and carries the flow of gases from a source (not shown) to inlet tubes 14 to enter reaction chamber 8 through apertures 15. The entire reactor, including both upper chamber 8 and lower chamber 34, is sealed from the ambient atmosphere to prevent contamination of the whiskers grown therein.

The entire gas inlet means, including axial conduit 38, inlet tubes 14 and rods 16, may be mechanically shaken or vibrated for removal or detachment of whiskers growing thereon. For example, vibrating means, shown as V in FIG. 4, may be connected to axial conduit 38 by vibrator rod 40 and vibrator collar 41. The vibrator may be actuated intermittently during the whisker growth to mechanically shake or vibrate conduit 38 and attached structures, and cause at least some of the whiskers to detach from the substrate surfaces defining the reaction chamber. The detached whiskers then fall gravitationally downward from reaction chamber 8 into collecting chamber 34, freeing at least some of the substrate surfaces in reaction chamber 8 for additional whisker growth. Sealing means such as flexible seal 42 may be provided at inlet opening 39 to prevent the ambient atmosphere from entering reactor 30 during the vibration of the gas inlet means.

Optionally, collecting tray 43 may be provided in collecting chamber 34 to hold the detached whiskers falling into the collecting chamber, preventing obstruction of outlet means 37 by the detached whiskers. Thermocouple 44 may be provided to extend into collecting chamber 15 to monitor the temperature therein.

In operation, the heating and hydrogen flushing steps, and the introduction of the reactant gases are carried out in a manner similar to that described above with respect to the reactor of FIG. 1, with the following exceptions. The flowing gases are introduced to axial conduit 38 at a point outside reactor 32, as shown by arrow 45, being directed by axial conduit 38 through inlet tubes 14 to reaction chamber 8. The flowing gases flow through reaction chamber 8 and collecting chamber 34, and exit the reactor through outlet means 37, as shown by arrows 46. During the whisker growth step, the reactant gases flow through heated reaction chamber 8 causing nucleation and growth of metal carbide, nitride, or carbonitride whiskers on the internal heated substrate surfaces. Reactant gases remaining in the stream of flowing gases leaving reaction chamber 8 may flow into or through cooler collecting chamber 34, depending on the position of outlet means 37. The temperature in collecting chamber 34 is maintained below the operating temperature required for nucleation and growth of the whiskers. Thus, no substantial nucleation or growth of the whiskers occurs within collecting chamber 34. If necessary, cooling means, such as cooling coils 47, may be utilized to maintain the cooler temperature in collecting chamber 34. Optionally, outlet means 37 may be disposed elsewhere in the reactor, preferably below reaction chamber 8.

The above descriptions of reactors according to the invention relate only to reactors in which the inlet means provides at least some of the substrate material surfaces. However, reactors (not illustrated) in which the outlet means comprises elements similar in structure to port 12 or 39, conduit 13 or 38, tubes 14 having apertures 15, and rods 16, and provides at least some of the substrate material surfaces, while ports similar to ports 17 or 37 provide the inlet means are within the scope of the invention. Also within the scope of the invention are reactors in which the inlet or outlet means include conduits similar to conduits 13 or 38, with or without rods 16, but no tubes, as inlet tubes 14. Alternatively, ports similar to ports 12 or 39 and 17 or 37 may provide the inlet and outlet means, without conduits or tubes. In this type of reactor, the inner surfaces of the reaction vessel walls normally provide all or nearly all of the substrate material surfaces for whisker growth, and the inlet and outlet ports are positioned to establish a gas flow path through the reaction chamber for whisker growth on the heated substrate surfaces.

The reactors according to the invention are also useful for the production of coated metal carbide, nitride, or carbonitride whiskers, the coating comprising one or more layers of metal carbides, nitrides or carbonitrides or oxides of Al, Zr or Hf, by the process described in detail in above-referenced application No. 06/899,835.

While there have been described what are at present believed to be the preferred embodiments according to the invention, it will be apparent to one of ordinary skill in the art that various changes and modifications may be made therein, without departing from the scope of the invention as defined by the appended claims.

What is claimed is:

1. A reactor for producing metal carbide, nitrde, or carbonitride single crystal whiskers comprising:
    A. a reaction vessel having outer walls generally enclosing a reaction chamber, sealed from the ambient atmosphere and adapted to cooperate with heating means for heating of the reaction chamber to an operating temperature suitable for whisker growth;
    B. gas inlet means; and
    C. gas outlet means; and
    D. wherein at least one of the outer walls, inlet means, and outlet means provides surfaces facing the reaction chamber formed from one or more substrate materials suitable for providing catalyzing and supporting substrates for nucleation and growth of the whiskers, the substrate materials are selected from the group consisting of nickel, an alloy containing at least 50% by weight nickel, and graphite impregnated with about 0.1–1.0 mole % nickel, and the surface area of the substrate material surfaces comprises at least a major portion of the total surface area of surfaces defining the reaction chamber.

2. A reactor according to claim 1 wherein at least one of the inlet means and the output means comprises one or more conduits extending into the reaction chamber from a port through the outer walls for gas flow to or from the reaction chamber, and providing at least some of the substrate material surfaces.

3. A reactor according to claim 2 wherein the at least one of the inlet means and the outlet means further comprises at least one rod extending from the one or more conduits into the reaction chamber, and providing at least some of the substrate material surfaces.

4. A reactor according to claim 1 wherein one of the inlet means and the outlet means comprises a conduit extending into the reaction chamber along its axis from a port through the outer walls; and a plurality of tubes operationally communicating with the conduit and extending radially from the conduit into the reaction chamber near the top wall; the port, the axial conduit and the tubes being arranged for gas flow to or from the reaction chamber.

5. A reactor according to claim 4 wherein the one of the inlet means and the outlet means further comprises at least one rod extending from the conduit radially into the reaction chamber, and providing at least some of the substrate material surfaces.

6. A reactor according to claim 1 wherein the reactor further comprises:
    E. a collection vessel having outer walls generally enclosing a collection chamber sealed from the ambient atmosphere, arranged generally vertically below and open to the reaction chamber, and adapted to be maintained at a temperature sufficiently below the operating temperature to preclude significant whisker production therein; and
    F. whisker detaching means arranged to periodically vibrate at least one of the outer walls, inlet means, and outlet means to detach at least some of the whiskers from the substrates.

7. A reactor according to claim 1 wherein the one or more substrate materials comprise nickel coated with a titanium carbide or titanium nitride layer about 20–30 microns thick.

8. A reactor for producing metal carbide, nitride, or carbonitride single crystal whiskers comprising:
  A. a vessel sealed from the ambient atmosphere comprising an upper reaction chamber and a lower collecting chamber;
  B. the upper chamber having a top wall and side walls, and being adapted to cooperate with heating means for heating of the reaction chamber to an operating temperature suitable for whisker growth;
  C. the lower chamber having a bottom wall, and being disposed generally vertically below and open to the upper chamber and generally coaxial therewith, and being adapted to be maintained at a temperature sufficiently below the operating temperature to preclude significant whisker production therein;
  D. gas inlet means comprising an inlet port through the bottom wall; a plurality of inlet tubes each having at least one aperture therethrough, and disposed near the top wall and extending radially across the upper chamber from near the axis of the chamber to near the side walls; and a conduit extending along the axes of the chambers and operationally interconnecting the inlet port and the inlet tubes for gas flow from the inlet port through the inlet tube apertures into the upper chamber;
  E. outlet means to permit the flowing gas to exit the vessel below the upper chamber; and
  F. a plurality of rods extending radially from the axial conduit into the upper chamber;
  G. wherein at least the inner surfaces of the side walls of the upper chamber, and the outer surfaces of the inlet tubes, the axial conduit, and the rods are formed from one or more substrate materials selected from the group consisting of nickel coated with a titanium carbide or nitride layer about 20–30 microns thick, an alloy containing at least 50% by weight nickel and coated with a titanium carbide or nitride layer about 20–30 microns thick, and graphite impregnated with about 0.1–1.0 mole % nickel; and further comprising
  H. whisker detaching means arranged to periodically, during operation, vibrate at least the axial conduit to detach at least some of the whiskers from the substrate surfaces.

9. A reactor according to claim 1 wherein the one or more substrate materials comprise an alloy containing at least 50% by weight nickel and coated with a titanium carbide or titanium nitride layer about 20–30 microns thick.

10. A reactor according to claim 1 wherein the one or more substrate materials comprise graphite impregnated with about 0.1–1.0 mole % nickel.